US006887317B2

(12) United States Patent
Or et al.

(10) Patent No.: US 6,887,317 B2
(45) Date of Patent: May 3, 2005

(54) REDUCED FRICTION LIFT PIN

(75) Inventors: David T. Or, San Jose, CA (US); Keith K. Koai, Los Gatos, CA (US); Hiroyuki Takahama, Sawara (JP); Takahiro Ito, Urayasu (JP); Koji Ota, Chiba (JP); Hiroshi Sato, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 107 days.

(21) Appl. No.: 10/241,005

(22) Filed: Sep. 10, 2002

(65) Prior Publication Data

US 2004/0045509 A1 Mar. 11, 2004

(51) Int. Cl.[7] .......................... H01L 21/00; C23C 16/00
(52) U.S. Cl. ...................... 118/728; 118/715; 118/725; 118/500; 156/345.51; 156/345.52; 156/345.53; 204/298.01; 204/298.04; 204/298.31; 204/298.32; 204/298.33; 204/298.34
(58) Field of Search ................... 118/725, 728, 118/500, 715; 156/345.51, 345.52, 345.53; 204/298.01, 298.04, 298.31, 298.32, 298.33, 298.34

(56) References Cited

U.S. PATENT DOCUMENTS

| 5,796,066 A | * | 8/1998 | Guyot .................. 219/121.48 |
| 5,848,670 A | | 12/1998 | Salzman ..................... 187/272 |
| 5,879,128 A | * | 3/1999 | Tietz et al. .................. 414/757 |
| 5,900,062 A | | 5/1999 | Loewenhardt et al. .. 118/723 R |
| 6,120,609 A | | 9/2000 | Selyutin et al. ............. 118/728 |
| 6,146,504 A | * | 11/2000 | Patadia et al. ......... 204/192.12 |
| 2002/0011204 A1 | | 1/2002 | Gujer et al. ................. 118/500 |
| 2003/0075387 A1 | * | 4/2003 | Wang et al. ................. 187/250 |

FOREIGN PATENT DOCUMENTS

JP          07176472 A   *  7/1995   ......... H01L/21/027

* cited by examiner

Primary Examiner—P. Hassanzadeh
Assistant Examiner—Ram N Kackar
(74) Attorney, Agent, or Firm—Moser, Patterson & Sheridan, LLP

(57) ABSTRACT

A substrate support is provided that features a lift pin having at least one larger diameter shoulder section that forms a relief region between the lift pin and a guide hole disposed through a substrate support. The shoulder section minimizes contact between the substrate support and lift pin guide hole, thereby reducing pin scratching, particle generation, component wear, and increasing the useful life of the pin. In another embodiment, a flat-bottom tip is provided to promote self-standing of the lift pin, reducing pin tilting or leaning of the lift pin within the guide hole.

12 Claims, 5 Drawing Sheets

US 6,887,317 B2

REDUCED FRICTION LIFT PIN

FIELD OF THE INVENTION

The present invention relates generally to an apparatus for semiconductor processing. More specifically, the invention relates to a lift pin utilized for spacing substrates from a substrate support.

BACKGROUND OF THE INVENTION

Integrated circuits have evolved into complex devices that include millions of transistors, capacitors and resistors on a single chip. The evolution of chip design results in faster circuitry and greater circuit density. As the demand for integrated circuits continues to rise, chip manufactures have demanded semiconductor process tooling having increased wafer throughput, greater product yield, and more robust processing equipment. To meet demands, tooling is being developed to minimize particle contamination and increase the service life of tool components.

One source of particle generation is the lift pins utilized to space a substrate from a substrate support, typically in a processing chamber. The lift pins generally reside in guide holes disposed through the substrate support. The upper ends of the lift pins are typically flared to prevent the pins from passing through the guide holes. The lower ends of the lift pins extend below the substrate support and are actuated by a lift plate that contacts the pins at their lower ends. The lift plate is movable in a vertical direction between upper and lower positions. In the upper position, the lift plate moves the lift pins through the guide holes formed through the substrate support to extend the flared ends of the lift pins above the substrate support, thereby lifting the substrate into a spaced apart relation relative to the substrate support to facilitate substrate transfer.

One problem that has been observed in the prior art is particle generation attributed to contact between the lift pins and the guide holes as the lift pins move through the substrate support. Specifically, contact of the sides of the lift pin with the bottom edge of the guide hole may cause deep scratches over the entire length of the lift pin. Additionally, as the scratched pin repeatedly passes through the guide holes of the substrate support, the lift pin becomes more susceptible to binding and galling, resulting in shortened lift pin service life.

Therefore, there is a need in the art for an improved lift pin.

SUMMARY OF THE INVENTION

An improved lift pin design for spacing a substrate from a substrate support is provided. The lift pin features at least one larger diameter shoulder section that forms a relief region between the pin and a guide hole disposed through a substrate support. The shoulder section minimizes contact between the substrate support and lift pin guide hole, thereby reducing pin scratching, particle generation, component wear, and increasing the useful life of the pin. In another embodiment, a flat-bottom tip is provided to promote self-standing of the lift pin, reducing pin tilting or leaning of the lift pin within the guide hole.

BRIEF DESCRIPTION OF THE DRAWINGS

The teachings of the invention can be readily understood by considering the following detailed description in conjunction with the accompanying drawings, in which.

DETAILED DESCRIPTION OF THE PREFERRED EMBODIMENTS

The present invention generally provides an apparatus for processing a semiconductor substrate. The invention is illustratively utilized in a processing system, such as a TxZ® CVD processing system, available from Applied Materials, Inc., of Santa Clara, Calif. However, it should be understood that the invention may be incorporated into other chamber configurations such as physical vapor deposition chambers, etch chambers, ion implant chambers, and other semiconductor processing chambers.

Figure 1:
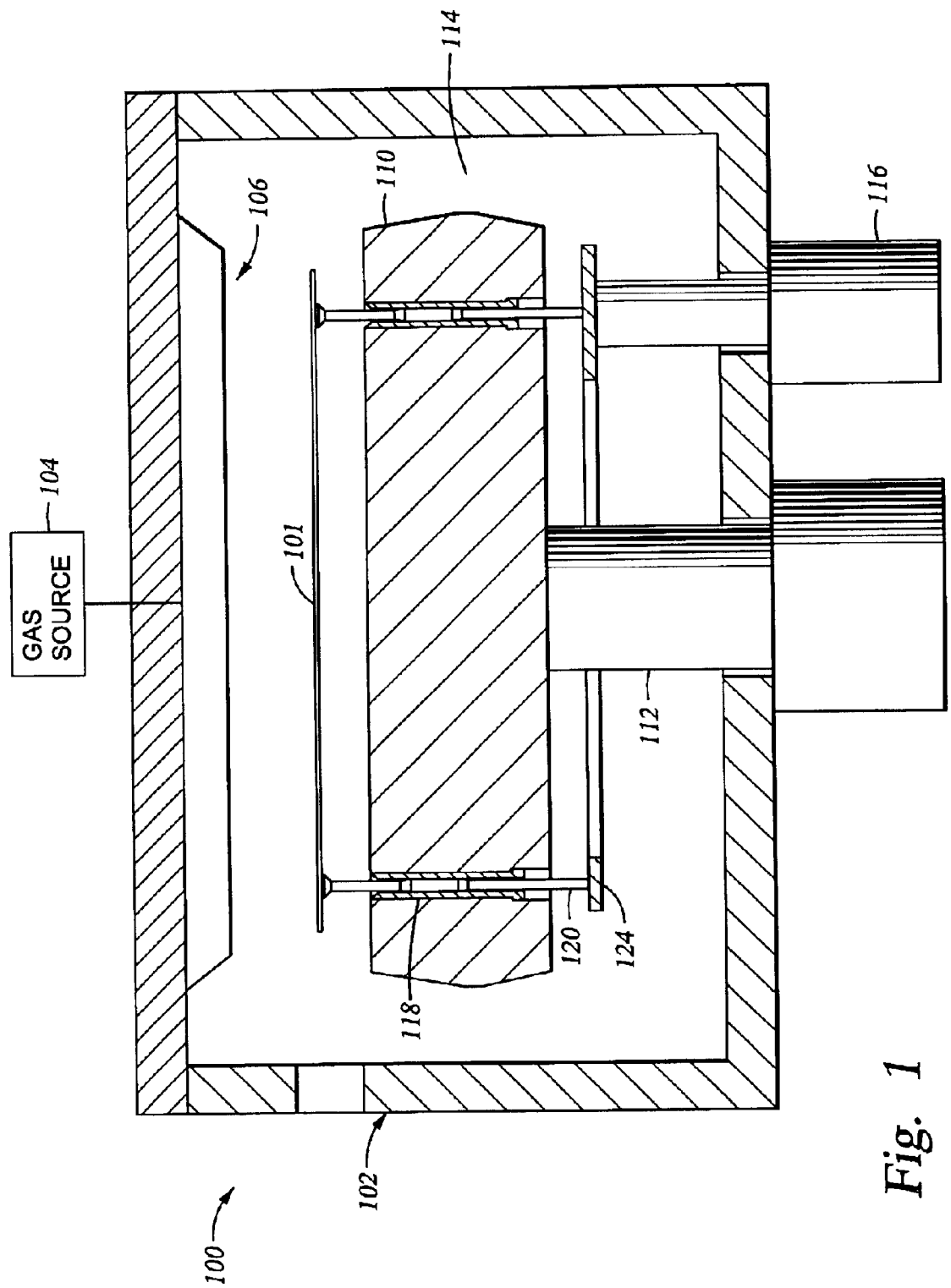
FIG. 1 is a sectional view of a metal deposition chamber.

FIG. 1 depicts a cross sectional view of a processing system 100. The system 100 generally comprises a chamber body 102 coupled to a gas source 104. The chamber body 102 is typically a unitary, machined structure fabricated from a rigid block of material such as aluminum. Within the chamber body 102 is a showerhead 106 and a substrate support assembly 108. The showerhead 106 is coupled to the upper surface or lid of the chamber body 102 and provides a uniform flow of gas from the gas source 104 that is dispersed over a substrate 101 positioned on a substrate support assembly 108.

The substrate support assembly 108 generally comprises a substrate support 110 and a stem 112. The stem 112 positions the substrate support 110 within the chamber body 102. The substrate 101 is placed upon the substrate support 110 during processing. The substrate support 110 may be a susceptor, a heater, an electrostatic chuck or a vacuum chuck. Typically, the substrate support 110 is fabricated from ceramic, aluminum, stainless steel or combinations thereof. The substrate support 110 has a plurality of guide holes 118 disposed therethrough, each hole 118 accommodating a lift pin 120 of a lift pin assembly 114.

The lift pin assembly 114 interacts with the substrate support 110 to position the substrate 101 relative to the substrate support 110. The lift pin assembly 114 typically includes the lift pins 120, a lift plate 124 and an actuator 116. The elevation of the lift plate 124 is controlled by the actuator 116. The actuator 116 may be a pneumatic cylinder, hydraulic cylinder, lead screw, solenoid, stepper motor or other motion device that is typically positioned outside of the processing chamber 102 and adapted to move the lift plate 124. As the lift plate 124 is moved towards the substrate support 110, the lift plate 124 contacts the lower ends of the lift pins 120 to move the lift pins 120 through the substrate support 110. The upper ends of the lift pins 120 move away from the substrate support 110 and lift the substrate 101 into a spaced-apart relation relative to the substrate support 110.

Figure 2:
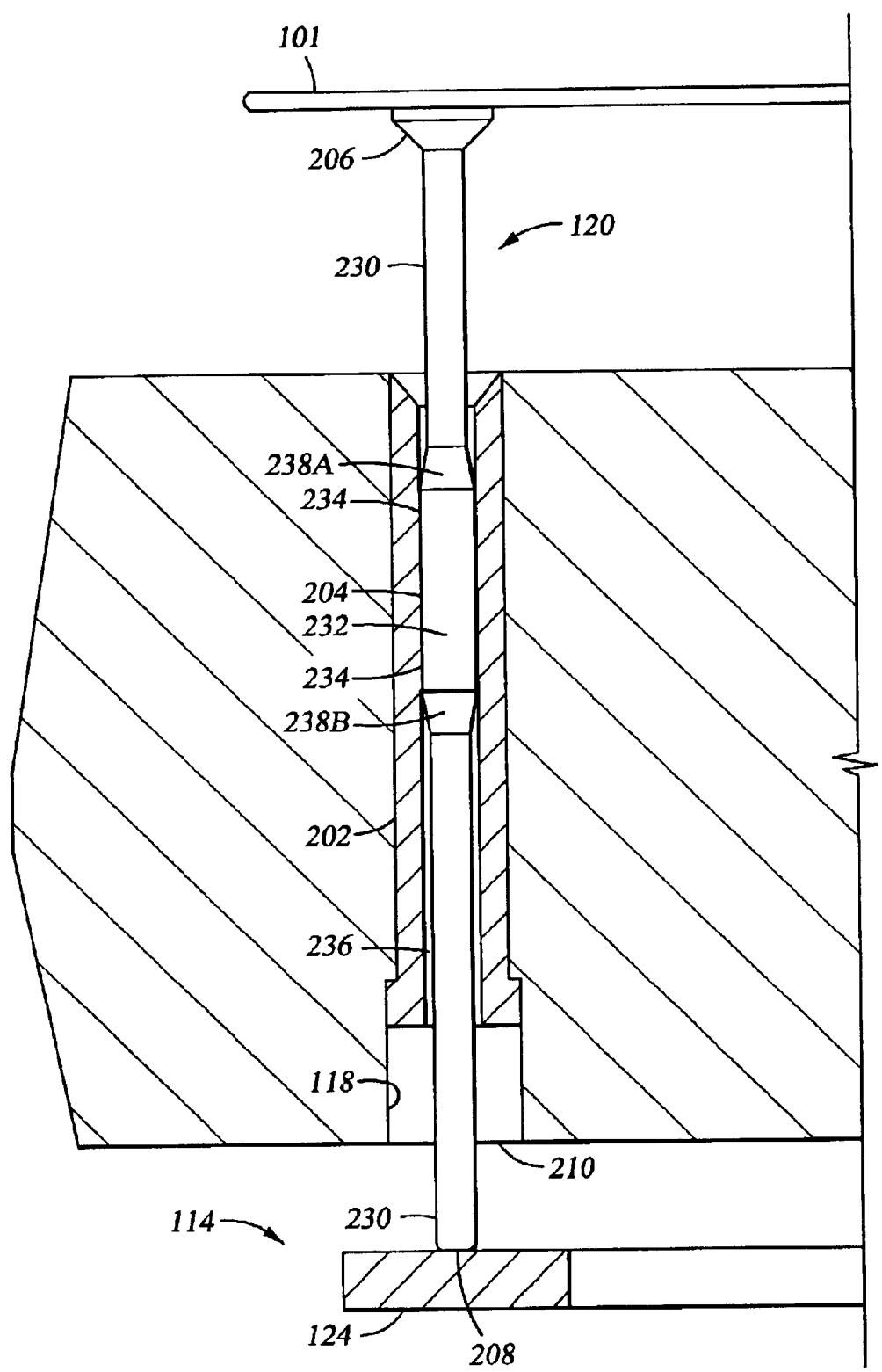
FIG. 2 is a sectional view of a lift pin assembly.

FIG. 2 is a sectional view of the lift pin assembly 114. The plurality of lift pins 120 are disposed axially through the lift pin guide holes 118 formed through the substrate support 110. The guide holes 118 may be integrally formed in the substrate support 110, or may alternatively be defined by an inner passage of a guide bushing 202 disposed in the substrate support 110 as depicted in FIG. 2. The guide bushing 202 is typically comprised of ceramic, stainless steel, aluminum or other suitable material.

The lift pins 120 are typically comprised of ceramic, stainless steel, aluminum, or other suitable material. A cylindrical bearing surface 204 of the lift pin 120 may additionally be treated to reduce friction and surface wear. For example, the cylindrical bearing surface 204 of the lift pin 120 may be hard chromium plated or electropolished to reduce friction and make the bearing surface 204 harder, smoother, and more resistant to scratching and corrosion.

A first end 206 of the lift pin 120 is flared to prevent the pin from falling through the guide hole 118 disposed through the substrate support 110. The guide hole 118 is typically countersinked to allow the first end 206 to be positioned substantially flush with or slightly recessed from the substrate support 110 when the pin 120 is in a normal position (i.e., retracted relative to the substrate support 110).

A second end 208 of the lift pin 120 extends beyond the underside of the substrate support 110 and is adapted be urged by the lift plate 124 to extend the first end 206 of the lift pin 120 above the substrate support 110. The second end 208 may be rounded, flat or have another shape. In one embodiment, the second end 208 is flat (i.e., oriented perpendicular to the center line of the lift pin 120). The flat second end 208 stands the lift pin 120 on the lift plate 124, thereby maintaining the lift pins 120 substantially parallel to a central axis of the lift pins guide holes 118, advantageously reducing binding and contact between the pin and a lower edge 210 of the guide holes 118. Moreover, the self-standing lift pin 120 is easily centered within the lift pin guide hole 118, reducing the likelihood that the lift pin 120 will tilt or lean in the guide hole 118, thereby becoming jammed or scratched.

The lift pin 120 is designed to slide smoothly through the guide hole 118 and features a shaft 230 having a larger diameter shoulder 232. The shoulder 232 includes tapered ends 238A, 238B that transition the shoulder 232 and the other portions of the shaft 230. The shoulder 232 bounds at least one relief region 236 formed between the shaft 230 and the lift pin guide hole 118. As the lift pins 120 move through the guide holes 118, only two points (indicted by reference numerals 234) of the bearing surface 204 formed by the shoulder 232 are in contact with the guide hole 118, the probability of the lift pin 120 being scratched or jamming as a result of contact with the bottom edge 210 of the lift pin guide hole 118 is minimized.

Figure 3:
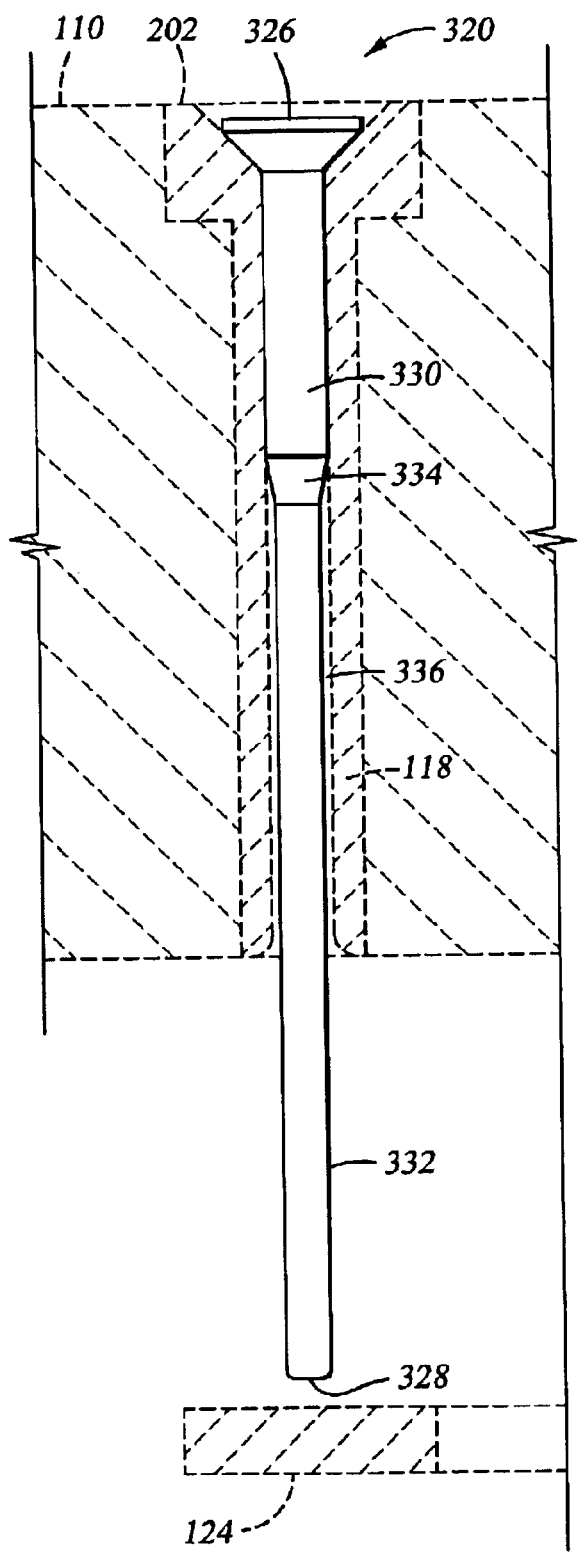
FIGS. 3–6 depict elevations of various alternative embodiments of a lift pin according to the present invention.

FIGS. 3–6 depict sectional views of several alternate embodiments according to the present invention. FIG. 3 depicts a lift pin 320 having a flared end 326 and a large radius (rounded) end 328. The rounded end 328 may have a full radius. A shaft 332 extends from the rounded end 328 and is separated from a larger diameter shoulder 330 by a tapered transition 334. The larger diameter shoulder 330 is the only part of the lift pin 320 that contacts the lift pin guide hole 118, while a relief region 336 is formed between the guide hole 118 of the guide bushing 202 (shown in phantom) and the shaft 332. The length of the larger diameter shoulder 330 is configured so that only the larger diameter shoulder 330 contacts the guide hole 118 during movement of the lift pin 320.

Figure 4:
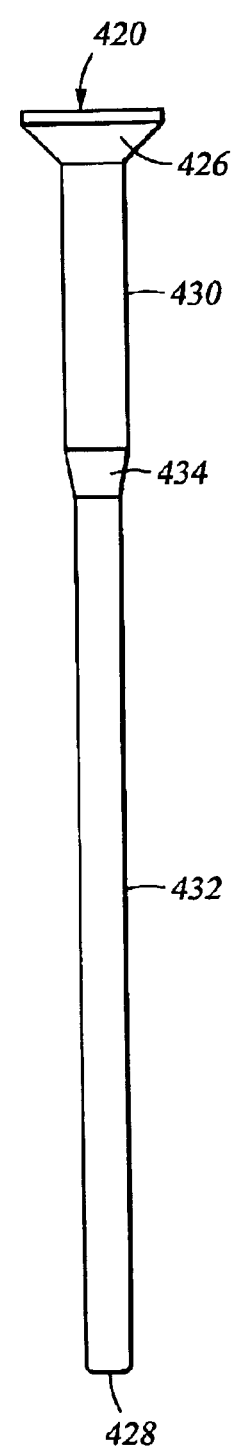

FIG. 4 depicts a lift pin 420 that features a flared end 426, a large diameter section (shoulder) 430, a shaft 432, and a tapered transition 434 that are similar to those of the lift pin 320. The lift pin 420 additionally features a flat end 428 that promotes self-standing and centering of the pin 420 within a guide hole (not shown).

Figure 5:
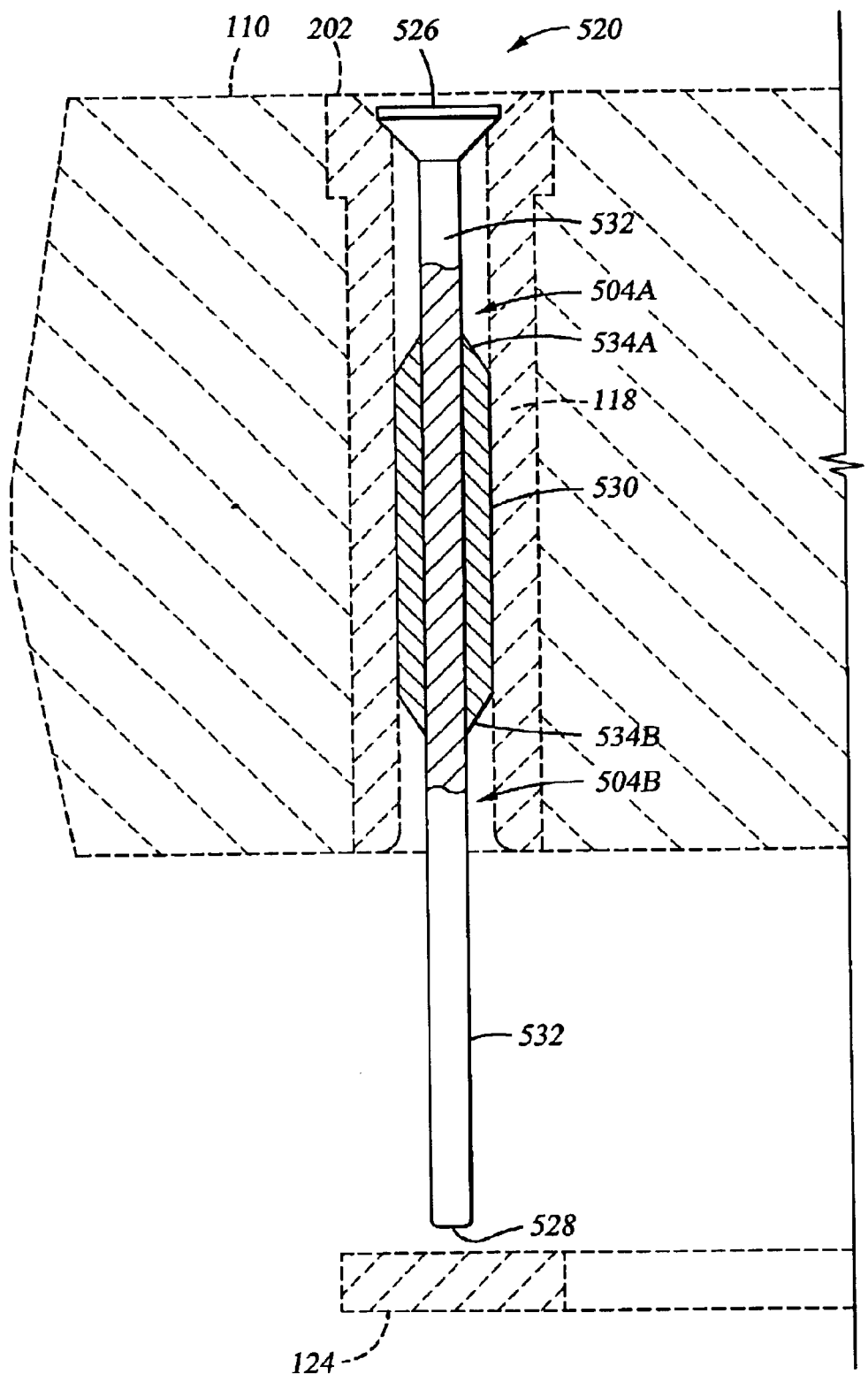

FIG. 5 is an embodiment of a lift pin 520 having a larger diameter shoulder 530 separating two narrower portions of a shaft 532. The shoulder 530 transitions to the shaft 532 at two tapered ends 534A, 534B. The shaft 532 is typically fabricated from aluminum, ceramic, stainless steel or other suitable material. The shaft 532 additionally includes a flared end 526 and a second end 528. The second end 528 is typically flat to promote self-standing of the lift pins 520 on lift plate 124 and centering of the lift pin 520 within the lift pin guide hole 118 (shown in phantom). Alternatively, the second end 528 of the lift pin 520 may be rounded.

The shoulder 530 is the only part of the lift pin 520 that contacts the lift pin guide hole 118, while defining relief regions 504A, 504B between the guide hole 118 and shaft 532. The shoulder 530 is typically fabricated from a different material than the shaft 532. In one embodiment, the shoulder 530 may be fabricated from stainless steel while the shaft 532 may be fabricated from another material, such as ceramic or aluminum. The shoulder 530 may also be hard chromium plated or electropolished to improve the service life and performance of the lift pin 520. Alternatively, the shoulder 530 may be fabricated from ceramic or aluminum, and coupled to a shaft 532 fabricated from a different material.

Figure 6:
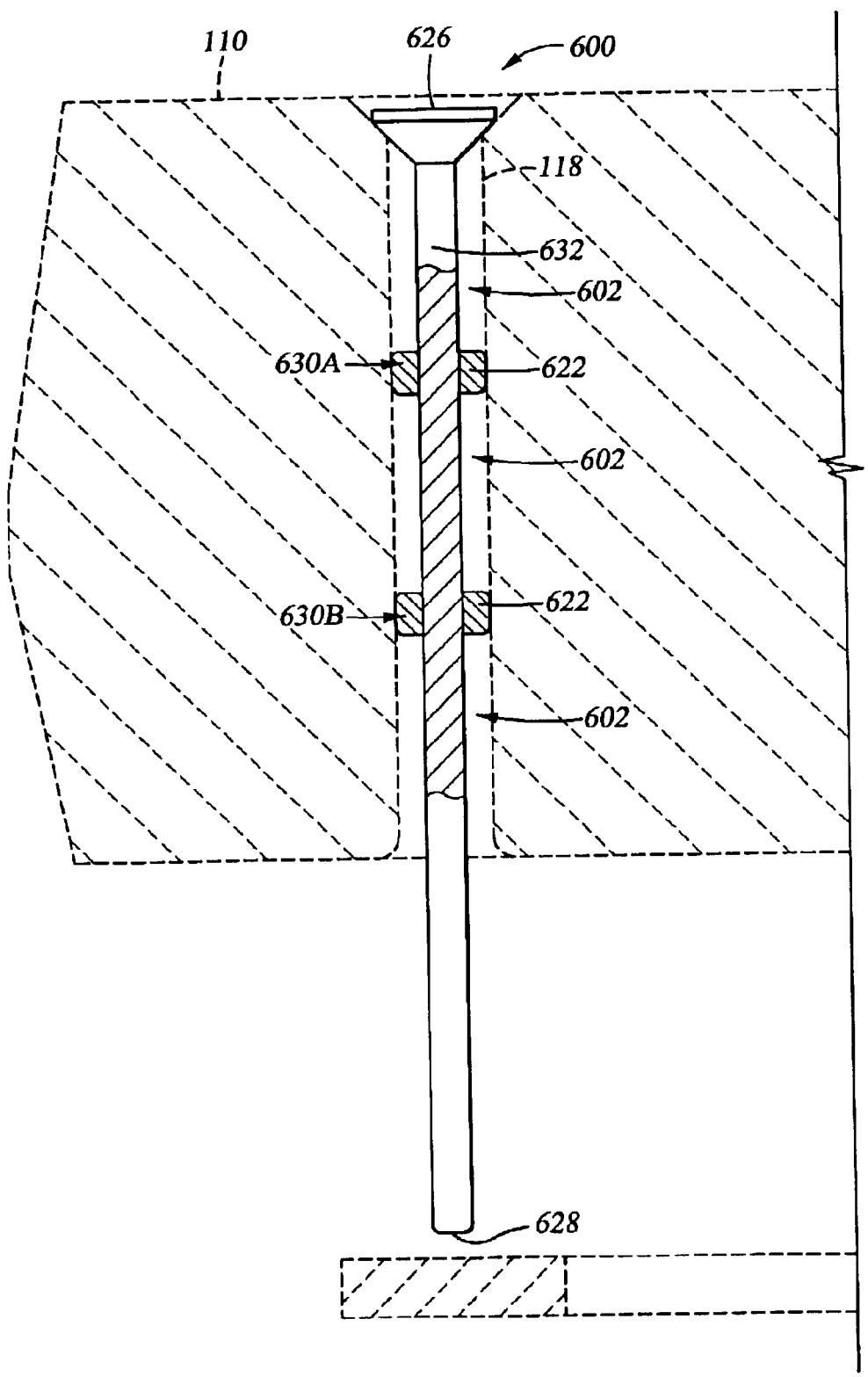

FIG. 6 depicts another alternate embodiment of a lift pin 600 according to the present invention. A lift pin 600 comprises a shaft 632 and two outwardly extending shoulders 630A, 630B spaced-apart along the length of the shaft 632. The lift pin 600 has a flared first end 626 and a second end 628. The second end 628 may have large radius, be rounded or flat. The shaft 632 is typically fabricated from aluminum, ceramic, stainless steel or other suitable material.

The shoulders 630A, 630B contact a lift pin guide hole 118 (shown in phantom), while relief regions 602 are formed between the guide hole 118 and the shaft 632 to minimize contact therebetween. The bearing surfaces 622 of the shoulders 630A, 630B are typically rounded to provide essentially point contact of the lift pin 600 with the guide hole 118. The shoulders 630A, 630B may be fabricated from a single block of material with the shaft 632, or as independent elements coupled together, similar to the lift pin described above with reference to FIG. 5. In one embodiment, the shoulders 630A, 630B are electropolished stainless rings disposed on a ceramic shaft 632. The shoulders 630A, 630B may alternatively be fabricated from ceramic or aluminum.

Therefore, an improved lift pin is provided that moves smoothly through a substrate support while minimizing particle generation typically associated with the lift pin and substrate support contact. The lift pin of the present invention also reduces scratching, binding and galling of the lift pins, thereby improving the quality and useful life of the pins so designed.

Although various embodiments which incorporate the teachings of the present invention have been shown and described in detail herein, those skilled in the art can readily devise many other varied embodiments that still incorporate these teachings.

What is claimed is:

1. An apparatus for selectively spacing a substrate from a substrate support, comprising:

a substrate support;

a lift pin guide hole disposed through the substrate support;

a lift pin shaft;

a first shoulder section circumscribing a portion of the lift pin shaft and disposed movably within the lift pin guide hole, the first shoulder section providing a bearing surface;

a flared head disposed against the first shoulder section; and a lift plate disposed proximate an end of the lift pin shaft.

2. The apparatus of claim 1 further comprising:

a lift pin guide disposed through a portion of the substrate support and having the lift pin guide hole formed therein.

3. The apparatus of claim 1, wherein the first shoulder section comprises a rounded surface that provides the bearing surface against the lift pin guide hole.

4. The apparatus of claim 1, wherein the lift pin shaft further comprises:

a flat end disposed opposite the flared head.

5. The apparatus of claim 1, wherein the first shoulder section is at least one of hard chromium plated or electropolished.

6. The apparatus of claim 1, wherein the lift pin shaft comprises one or more sections of lesser diameter than the first shoulder section.

7. The apparatus of claim 1, wherein the first shoulder section includes tapered ends that transition the first shoulder section and the lift pin shaft.

8. The apparatus of claim 1, wherein the lift pin shaft further comprises a round end opposite the flared end.

9. An apparatus for selectively spacing a substrate from a substrate support, comprising:

a pin shaft having a first section having a larger diameter than a second section, the first section providing a bearing surface;

a flared end adapted to support the substrate thereon and coupled to the first section of the pin shaft; and a substrate support having a hole formed therethrough, the hole having the first section of the pin shaft movably disposed therein.

10. The apparatus of claim 9, wherein the lift pin shaft further comprises a flat end opposite the flared head.

11. The apparatus of claim 9, wherein the first section is at least one of hard chromium plated or electropolished.

12. The apparatus of claim 9, wherein the lift pin shaft further comprises a round end opposite the flared end.

* * * * *

UNITED STATES PATENT AND TRADEMARK OFFICE
CERTIFICATE OF CORRECTION

PATENT NO. : 6,887,317 B2
DATED : May 3, 2005
INVENTOR(S) : David T. Or et al.

It is certified that error appears in the above-identified patent and that said Letters Patent is hereby corrected as shown below:

Column 6,
Line 13, remove "lift".

Signed and Sealed this

Sixteenth Day of August, 2005

JON W. DUDAS
*Director of the United States Patent and Trademark Office*